United States Patent
Dyka et al.

(10) Patent No.: US 9,824,984 B2
(45) Date of Patent: Nov. 21, 2017

(54) INDIVIDUALISED VOLTAGE SUPPLY OF INTEGRATED CIRCUITS COMPONENTS AS PROTECTIVE MEANS AGAINST SIDE CHANNEL ATTACKS

(71) Applicant: IHP GmbH—Innovations for High Performance Microelectronics/Leibniz-Institut Fur Innovative Mikroelektronik, Frankfurt an der Oder (DE)

(72) Inventors: Zoya Dyka, Frankfurt (DE); Peter Langendorfer, Frankfurt (DE)

(73) Assignee: IHP GMBH—INNOVATIONS FOR HIGH PERFORMANCE MICROELECTRONICS/LEIBNIZ-INSTITUT FUR INNOVATIVE MIKROELECTRONIK, Frankfurt (Oder) (DE)

( * ) Notice: Subject to any disclaimer, the term of this patent is extended or adjusted under 35 U.S.C. 154(b) by 0 days.

(21) Appl. No.: 14/438,341

(22) PCT Filed: Oct. 25, 2013

(86) PCT No.: PCT/EP2013/072447
§ 371 (c)(1),
(2) Date: Aug. 18, 2015

(87) PCT Pub. No.: WO2014/064275
PCT Pub. Date: May 1, 2014

(65) Prior Publication Data
US 2015/0380365 A1     Dec. 31, 2015

(30) Foreign Application Priority Data
Oct. 26, 2012  (DE) .......... 10 2012 219 661

(51) Int. Cl.
*H01L 23/48*     (2006.01)
*H01L 23/00*     (2006.01)
(Continued)

(52) U.S. Cl.
CPC .......... *H01L 23/573* (2013.01); *H01L 23/528* (2013.01); *H01L 23/5226* (2013.01);
(Continued)

(58) Field of Classification Search
CPC .............. H01L 23/573; H01L 27/0292; H01L 23/5226; H01L 23/528
See application file for complete search history.

(56) References Cited

U.S. PATENT DOCUMENTS 6,243,265 B1   6/2001  Wong et al.
6,791,191 B2   9/2004  Chow et al.
(Continued)

FOREIGN PATENT DOCUMENTS

WO   2009/031057 A2   3/2009

OTHER PUBLICATIONS

Sergei P. Skorobogatov; "Semi-invasive attacks—A new approach to hardware security analysis;" Technical Report; University of Cambridge, United Kingdom; Apr. 2005; whole document.
(Continued)

*Primary Examiner* — A. Sefer
(74) *Attorney, Agent, or Firm* — Ware, Fressola, Maguire & Barber LLP

(57) ABSTRACT

A semiconductor device, in particular an integrated circuit with protection against side channel attacks, in particular imaging- and probing-based attacks, EMA and reverse engineering, in which a metallic conductive layer of a first (104) and/or a second potential supply line (106) are each con-
(Continued)

nected directly and individually to all the circuit components via respective individual conductor path structures (V1, V2).

14 Claims, 10 Drawing Sheets

(51) Int. Cl.
    *H01L 23/532*     (2006.01)
    *H01L 23/528*     (2006.01)
    *H01L 27/118*     (2006.01)
    *H01L 27/02*     (2006.01)
    *H01L 23/522*     (2006.01)

(52) U.S. Cl.
    CPC .... *H01L 23/5286* (2013.01); *H01L 23/53204* (2013.01); *H01L 27/0292* (2013.01); *H01L 27/11807* (2013.01); *H01L 2924/0002* (2013.01)

(56) References Cited

U.S. PATENT DOCUMENTS

| | | | |
|---|---|---|---|
| 6,865,804 B2 | 3/2005 | Youker et al. | |
| 7,240,314 B1 | 7/2007 | Leung | |
| 7,989,918 B2 | 8/2011 | Bartley et al. | |
| 8,049,119 B2 | 11/2011 | Beddingfield et al. | |
| 8,143,705 B2 | 3/2012 | Van Geloven et al. | |
| 2002/0100960 A1 | 8/2002 | Chang et al. | |
| 2009/0193271 A1* | 7/2009 | Chuang | H01L 23/5286 713/300 |
| 2010/0078636 A1 | 4/2010 | Zachariasse | |
| 2010/0140758 A1 | 6/2010 | Doherty et al. | |
| 2010/0155700 A1 | 6/2010 | Chang et al. | |
| 2011/0049684 A1 | 3/2011 | Lee et al. | |
| 2013/0063203 A1* | 3/2013 | Utsumi | G11C 5/063 327/530 |

OTHER PUBLICATIONS

Jean-Jacques Quisquater, et al; "ElectroMagnetic Analysis (EMA): Measures and Countermeasures for Smart Cards;" Belgium; 2001; pp. 200-210.
E. De Mulder, et al; "Electromagnetic Analysis Attack on an FPGA Implementation of an Elliptic Curve Cryptosystem"; IEEE 2005; EUROCON 2005 Belgrade, Nov. 22-24, 2005; pp. 1879-1882.
Michael Hutter, et al; "Exploiting the Difference of Side-Channel Leakages"; Austria/Germany; 2012; pp. 1-16.
Karine Gandolfi, et al; "Electromagnetic Analysis: Concrete Results"; France; 2001; pp. 251-261.
Altera Corporation; "Anti-Tamper Capabilities in FPGA Designs"; White Paper; San Jose, CA; Jul. 2008; pp. 1-9.

* cited by examiner

INDIVIDUALISED VOLTAGE SUPPLY OF INTEGRATED CIRCUITS COMPONENTS AS PROTECTIVE MEANS AGAINST SIDE CHANNEL ATTACKS

CROSS REFERENCE TO RELATED APPLICATIONS

This application is the U.S. National Stage of International Application Number PCT/EP2013/072447 filed on Oct. 25, 2013 which application claims priority under 35 USC §119 to German Patent Application No. 10 2012 219 661.7 filed on Oct. 26, 2012. Both applications are hereby incorporated by reference in their entirety.

TECHNICAL FIELD

The invention relates to a semiconductor device, in particular an integrated circuit with protection against side channel attacks, in particular imaging- and probing-based attacks, EMA and reverse engineering.

BACKGROUND OF THE INVENTION

Integrated circuits may contain or process information that is of relevance for security, or that needs to be kept secret. Data carrying such information are encrypted for that reason. An integrated circuit which processes or stores encrypted data, or which encrypts unencrypted data, is referred to in the context of the present application as a cryptographic circuit, or conterminously as a cryptographic semiconductor device.

Attacks against cryptographic circuits are targeted at information which allows decryption of the data processed or stored by the circuit. In order to gain access to such information, analyses of the measurable analog parameters of a circuit (operation execution times, power consumption) or of the physical parameters of their environment (sound, electromagnetic radiation), as well as analyses of the inner structure of the circuits are performed.

Analysis of the analog parameters of the circuit or of the physical parameters of their surroundings can often be done using non-invasive methods. Knowledge of the analog circuit parameters and of changes in the physical parameters of the surroundings of an active circuit already allows conclusions to be drawn about keys used in a circuit. SEMA (simple electromagnetic analysis), DEMA (differential electromagnetic analysis) and CEMA (correlation electromagnetic analysis) are different known types of EMA (electromagnetic analysis). They belong to the class of relatively cheap, non-invasive attacks and are based on analysis of the electromagnetic radiation in the immediate surroundings of a cryptographic circuit contained in the semiconductor device.

Known measures for counteracting EMA include component screening, changing the signal-to-noise ratio and the use of masking. Basic shielding of integrated circuits, in the form of a Faraday cage for protecting the component electrostatically, and as a protective measure against the propagation of electromagnetic radiation caused by a circuit in operation, is known from U.S. Pat. No. 8,049,119 B2, for example. Using a chip carrier to carry part of an internal grounding layer for shielding an integrated circuit is described in U.S. Pat. No. 6,865,804 B2. U.S. Pat. No. 6,243,265 B1 shows a heat sink for an integrated circuit being connected to the ground potential and the use of this arrangement to shield the IC. Such shielding measures can provide protection against non-invasive EMA. Removing these protective layers, which then has to be done as well in order to perform a successful EMA, can be achieved with relatively little effort in the case of these known designs, however.

To obtain knowledge about the internal structure of a cryptographic circuit, invasive and semi-invasive attacks are carried out with the aim of gaining optical access to the inner structure of the circuit. In the case of such an invasive or semi-invasive attack, the circuit has to be unpacked, but its inner structure must remain fully functional, so that cryptographic operations can still be carried out, for example. If the structure is destroyed, it must be restored again in order to observe such operations. By a probing-based attack is meant local detection, using measurement technology, of the values of memory or circuit elements, for example while a cryptographic algorithm is being performed by the cryptographic circuit.

One known measure against semi-invasive and invasive attacks is above all the use of active sensors to detect mechanical attacks and, in response, to render structural information about the attacked semiconductor component unusable. US 2010/0078636 A1, for example, describes the integration of light-emitting and light-sensitive components and a reflective rear wall, so that any tampering with the rear wall causes interference in the signal received by the light-sensitive components. U.S. Pat. No. 7,989,918 B2 shows the use of a capacitor, the capacitance of which changes when the thickness of a chip is reduced, and oscillator circuitry that detects such changes in capacitance. In U.S. Pat. No. 8,143,705 B2, an electrically conductive protective layer is used, the resistance of which is measured, and in the event of any tampering with the protective layer, the change in its resistance causes a code different from the reference code to be generated.

SUMMARY OF THE INVENTION

The present invention proposes a semiconductor device comprising
  a substrate,
  a component layer on said substrate, said component layer containing a plurality of electronic circuit components in the form of monolithically integrated single components or logic gates,
  a conductor path stack on a side of the component layer facing away from the substrate,
  a first monolithically integrated potential supply line which is connected or connectable to an electrical reference potential, and
  a second monolithically integrated potential supply line which is connected or connectable to an electrical supply potential, wherein
  the first potential supply line or the second potential supply line or the first and the second potential supply line have at least one metallic conductive layer,
  the metallic conductive layer of the first and the second potential supply line are separated from one another by at least one dielectric layer and wherein
the metallic conductive layer of the first and/or of the second potential supply line are each connected directly and individually to all the circuit components via respective individual conductor path structures.

The present invention provides a semiconductor device which is protected against non-invasive attacks (EMA, PA) and also against invasive or semi-invasive attacks. In many cases, prior art protective systems take action against single kinds of attacks only, i.e., either in cases of EMA or against structural analysis, or against optical attacks. Developing a protection mechanism which is effective against several kinds of attacks simultaneously is particularly advantageous for that reason, and facilitates secure hardware implementation of cryptographic algorithms.

The invention is based on the realization that, when invasive and semi-invasive attacks are carried out, a semiconductor device would have to remain in a functional state, even after unpacking, so that the attacker can understand or affect the functions of the circuit (or a part of the circuit) and can extract keys. To achieve this, all the gates would have to be supplied with the operating voltage after unpacking (supply potential $V_{dd}$ and reference potential GND). In the prior art, the gates are typically connected to a common GND conductor path and to a common Vdd conductor path. These two conductor paths are arranged alternately in a common metal layer in order to connect gates, transistors or standard cells as easy as possible. In the prior art, this is generally done in the first metal layer of the conductor path stack ($M_1$), which is arranged directly above the component layer.

The at least one metallic conductive layer in the semiconductor device according to the invention acts not only as a shield against the electromagnetic radiation—i.e., against an EMA attack—, but also to screen deeper layers from view. Semi-invasive attacks, such as imaging and error detection using optical, UV and laser radiation can thus be prevented. In order to carry out the attack, the metallic conductive layer would have to be removed or at least damaged when attacked. However, due to the metallic conductive layer supplying the individual components or logic gates with the supply potential of the operating voltage or the reference potential, in its function as supplier of potential, the semiconductor device can no longer operate after this metallic conductive layer has been removed. The operating voltage supply would have to be reconnected individually to each of the circuit components that have previously been individually connected to the metallic conductive layer. However, restoring these contacts consumes time and money, given that the number of logic gates typically amounts to several thousand in the case of cryptographic algorithms, for example. The voltage supply could be re-established with the aid of an FIB (Focused Ion Beam) facility, for example, but suitable contacts would then have to be individually implanted for all the circuit components that had previously been connected. The effort involved just to implant an area of only 10 μm×1 μm (i.e., ignoring preparation time) is already about 30 minutes, which is very substantial, so such an attack is made unattractive as a result.

Embodiments of the inventive layer structure shall now be described. The additional features of the embodiments may be combined with each other to form other embodiments, unless they are explicitly described as alternatives to each other.

The at least one metallic conductive layer of the semiconductor device according to the invention is preferably disposed in a level which is further away from the component layer than the first metal layer of the conductor path stack.

Instead of providing only the first potential supply line (GND) or only the second potential supply line ($V_{dd}$) as at least one metallic conductive layer, it is also possible to provide both of the potential supply lines, that is say the first and the second potential supply line, in the form of the respective one or more metallic conductive layers. The protective effect is reinforced in that case, because it is now necessary for both of the potential supply lines to be removed in order to obtain optical access to the component layer and to remove the screening effect. The effort required to restore the contacts is therefore increased, and additional knowledge is also necessary to make the contacts correctly. Another aspect in this embodiment is that at least one metallic conductive layer is provided in each level for both of the potentials, i.e., for the supply and the reference potential, before any attack. After removing these layers in an attack, the respective wiring to both of the potentials would have to be realized in an attack, but in only one level in each case. That, too, entails a significant increase in the effort that reconstruction involves.

In this embodiment, at least one of the two potential supply lines, i.e., the metallic conductive layers, is not realized in the lowermost metallization level (M1). It is preferable that both of the metallic conductive layers for both of the potential supply lines are not realized in the lowermost metallization level M1, but in higher metallization levels instead, as will be described further below with reference to further embodiments and different variants thereof.

In one alternative embodiment of the semiconductor device, the metallic conductive layer of the first and of the second potential supply line are arranged laterally adjacent to one another in a shared level parallel to a main surface of the substrate and are electrically insulated from one another. For example, a left half of the respective level (in relation to the lateral dimensions of the semiconductor device) could serve as a metallic conductive layer of a GND potential supply line, and a right half as a Vdd potential supply line. Electrical insulation is provided between the two halves. In this way, the intellectual effort needed to restore the contacts in the event of an attack can be increased still further in order to provide even better protection of the semiconductor device.

In the following, variants relating to different ways of embodying the metallic conductive layer which forms the potential supply line will be described. In one embodiment, the at least one metallic conductive layer of the first or the second contact advantageously forms a surface which is either completely without openings or which, apart from at least one via leadthrough or very small openings for preventing mechanical stress, is without openings, and whose perpendicular projection onto the component layer substantially or completely covers said component layer. A layer which is enclosed within a layer in a surface is also advantageous, in particular when it is arranged in the uppermost metallization level of the conductor path stack. However, it does not have to be embodied as an enclosed surface. In one variant, the metallic conductive layer contains openings which can be used, for example, to provide leadthroughs for connecting elements (vias), or which can be filled instead with a dielectric material only. Alternatively, the metallic conductive layer may be embodied as a contiguous metallic conductor path lying in a single plane of the layer, or as a contiguous gate made of metallic conductive conductor paths and lying in a single plane of the layer. A gate differs in this context, due to its continuously regular, right-angled structures, from a grid, which can also contain irregular and non-right-angled structures. One aspect that all these alternative embodiments of the metallic conductive layer have in common is that they shield the electromagnetic radiation emitted by an operating circuit, and simultaneously screen the inner structure of the circuit from view.

It is advantageous when at least one of the contacts has leadthroughs with vias (Vertical Interconnect Accesses) that run perpendicularly to the layer, and by means of which the other metallic levels of the conductor path stack, for example, or the other contact, are connected to the circuit components. These leadthroughs advantageously form openings which have electrical insulation where their edge meets the metallic conductive layer.

In the aforementioned embodiment of the semiconductor device in which the metallic conductive layer of the first and of the second potential supply line are arranged laterally adjacent to one another in a shared level parallel to a main surface of the substrate and are electrically insulated from one another, it is preferred that a perpendicular projection of said metallic conductive layers of the first and the second potential supply line onto the component layer substantially or completely covers the component layer. The same applies, of course, apart from a lateral spacing which is necessary for electrical insulation of the two metallic conductive layers of the first and the second potential supply line from each other within the shared level. This spacing is typically filled with a dielectric material. In variants of this embodiment, more complex ways than halving are used to partition areas in the respective plane through the metallic conductive layers of the two potential supply lines, namely by dividing into thirds, for example, or into quarters or into chessboard patterns or similar. The sub-areas in these partitions are electrically insulated from each another if they are assigned to different potentials. The respective sub-areas having the same potential can be electrically connected to each other using individual supply sections, for example, or be connected to each other within the common level of the metallic conductive layers themselves. Sub-areas of the same potential can thus be coupled electrically with each other at their diagonal corners, for example, by using a chess pattern within the same level.

It is particularly advantageous when the at least one metallic conductive layer of one or two potential supply lines is embodied inside the conductor path stack. Such an embodiment ensures that visual protection and a shielding effect are provided. At the same time, there is an increased risk for the attacker that an attack will also destroy other metallization levels of the conductor path stack at least partially on removing the metallic layers of the first or second contact, which means that those levels are no longer accessible for analysis. It is therefore particularly advantageous if one or more conductor path levels for wiring the circuit components are arranged between at least two metallic conductive layers of the first or second contact, because the conductor path levels lying between the contact layers would have to be removed here in the event of an attack in order to come closer to the component layer, as a result of which the wiring of the circuit components would be destroyed.

Arranging a metallic conductive layer of the first potential supply line or the second potential supply line in a conductor path level in the conductor path stack which is furthest away from the component layer, in comparison with all the other conductor path levels in the conductor path stack, is advantageous, in that it provides protection not only against optical inspection, but also against EMA and against probing-based attacks. Arranging the metallic conductive layer at a large distance away from the component layer, that is to say near the top side of the component, ensures that the protective effect achieved by the invention becomes effective at an early stage in the event of an attack from the top side of the semiconductor device.

It is also advantageous to arrange the first potential supply line, with exactly one first metallic conductive layer belonging to it, and the second potential supply line, with exactly one second metallic conductive layer belonging to it, on adjacent conductor path levels of the conductor path stack. In such an arrangement, the metallic conductive layers are separated by an insulating layer, as is known, with the result that these three areas together form a smoothing capacitor that suppresses interference in the supply lines. This allows the reliability of the circuit to be enhanced, in addition. In this way, non-invasive attacks can also be made more difficult, at least, because the smoothing capacitor smooths the current pulses that are formed when the gates are switched.

One particularly suitable embodiment of the invention is one in which the plurality of electronic circuit components includes more than 100 circuit components, and more particularly more than 1000 circuit components. There is no upper limit to the number of circuit components. One advantage here is that the more elements that have to be wired together, the greater the time consumed and the complexity of the new wiring necessary after an attack.

If, as a result of the invention, there is a greater density of conductor paths in the conductor path stack, this can be mitigated if necessary by adding further conductor path levels.

Electronic circuit components are to be understood in this regard to be single components such as transistors or diodes, or logic gates in other embodiments.

BRIEF DESCRIPTION OF THE DRAWINGS

Other embodiments of the inventive layer structure shall now be described with reference to the Figures, in which.

DETAILED DESCRIPTION

Figure 1:
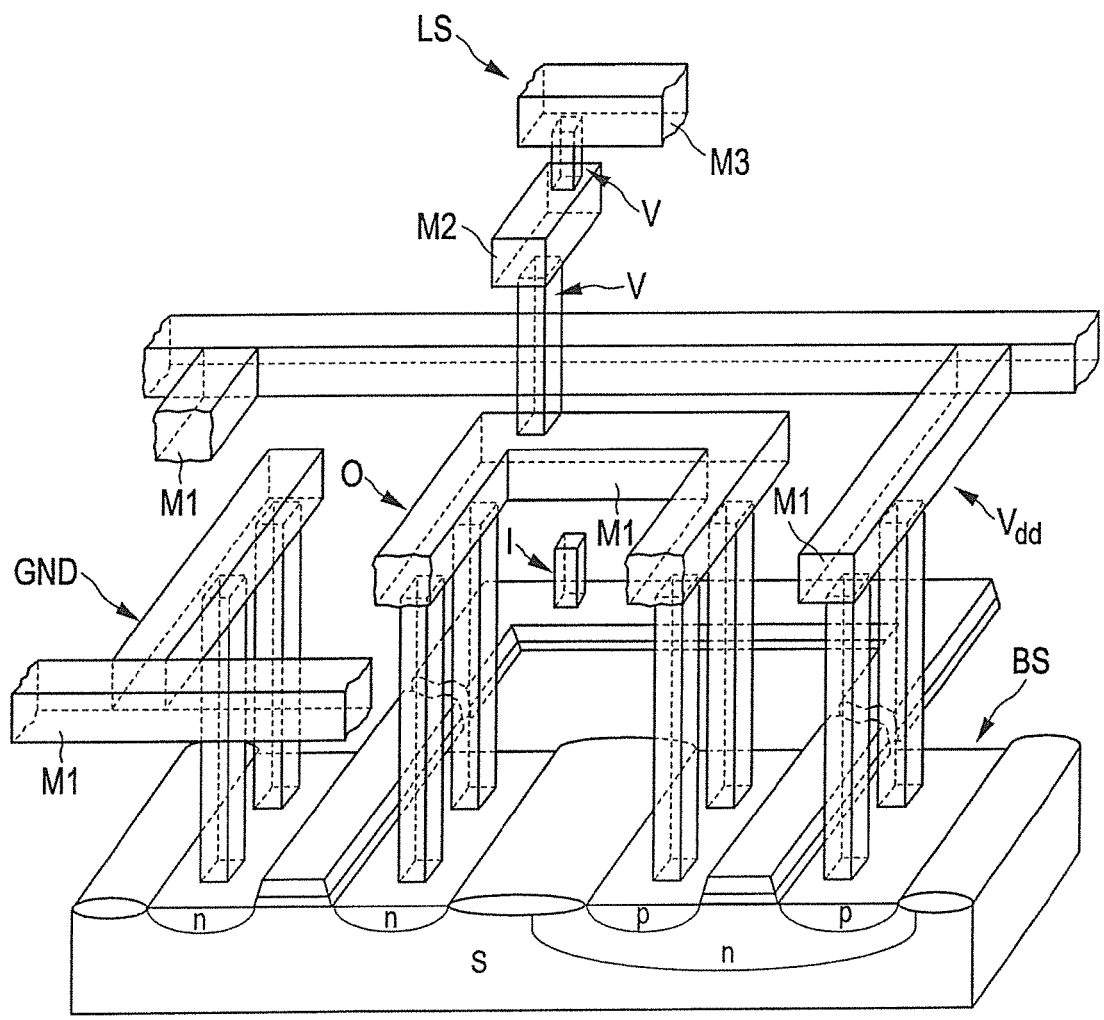
FIG. 1 shows a schematic view of a semiconductor device according to the prior art, in a simplified exploded view.
Figure 2:
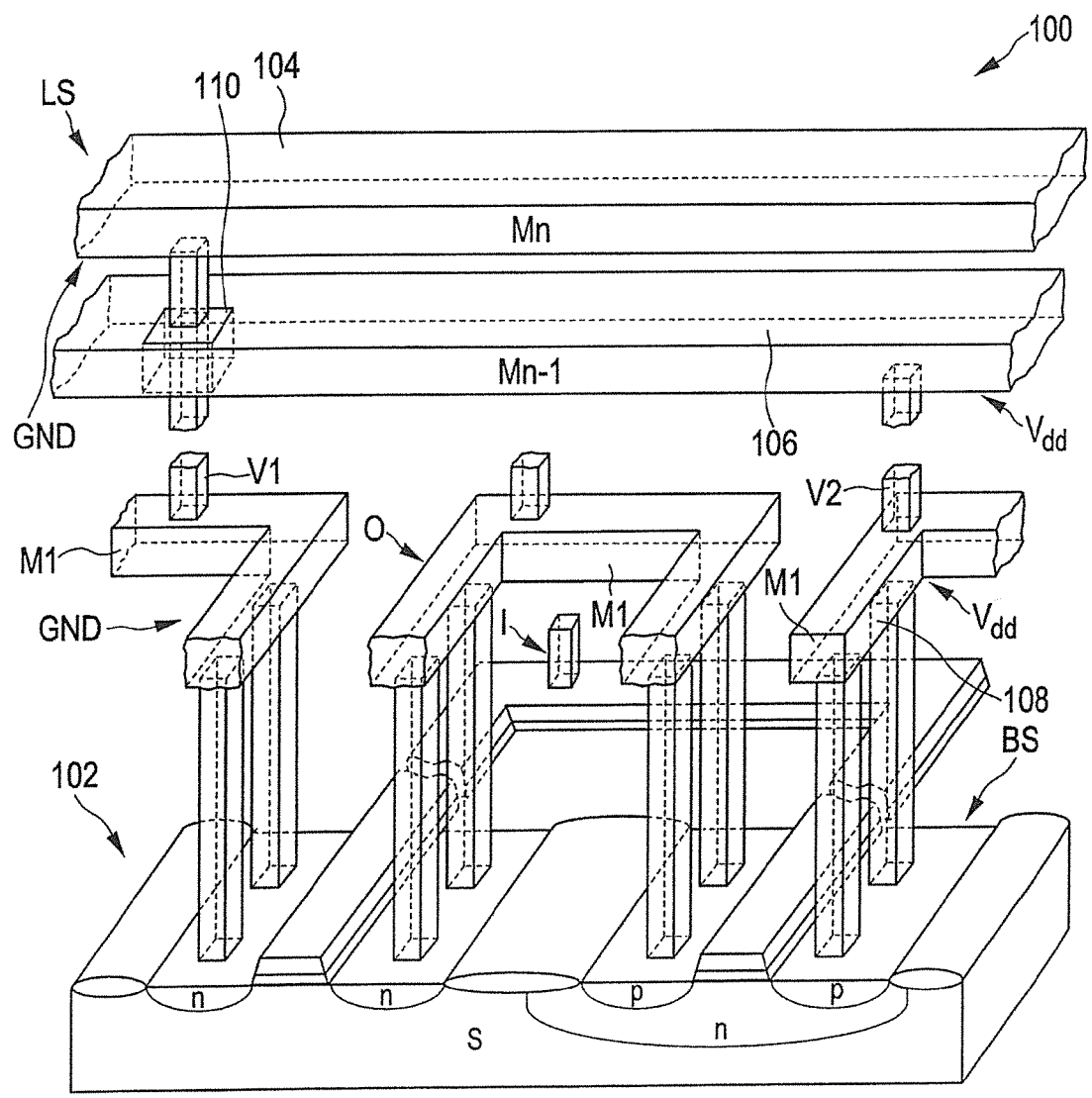
FIG. 2 shows a schematic view of an embodiment of the semiconductor device according to the invention, in a simplified exploded view.
Figure 3:
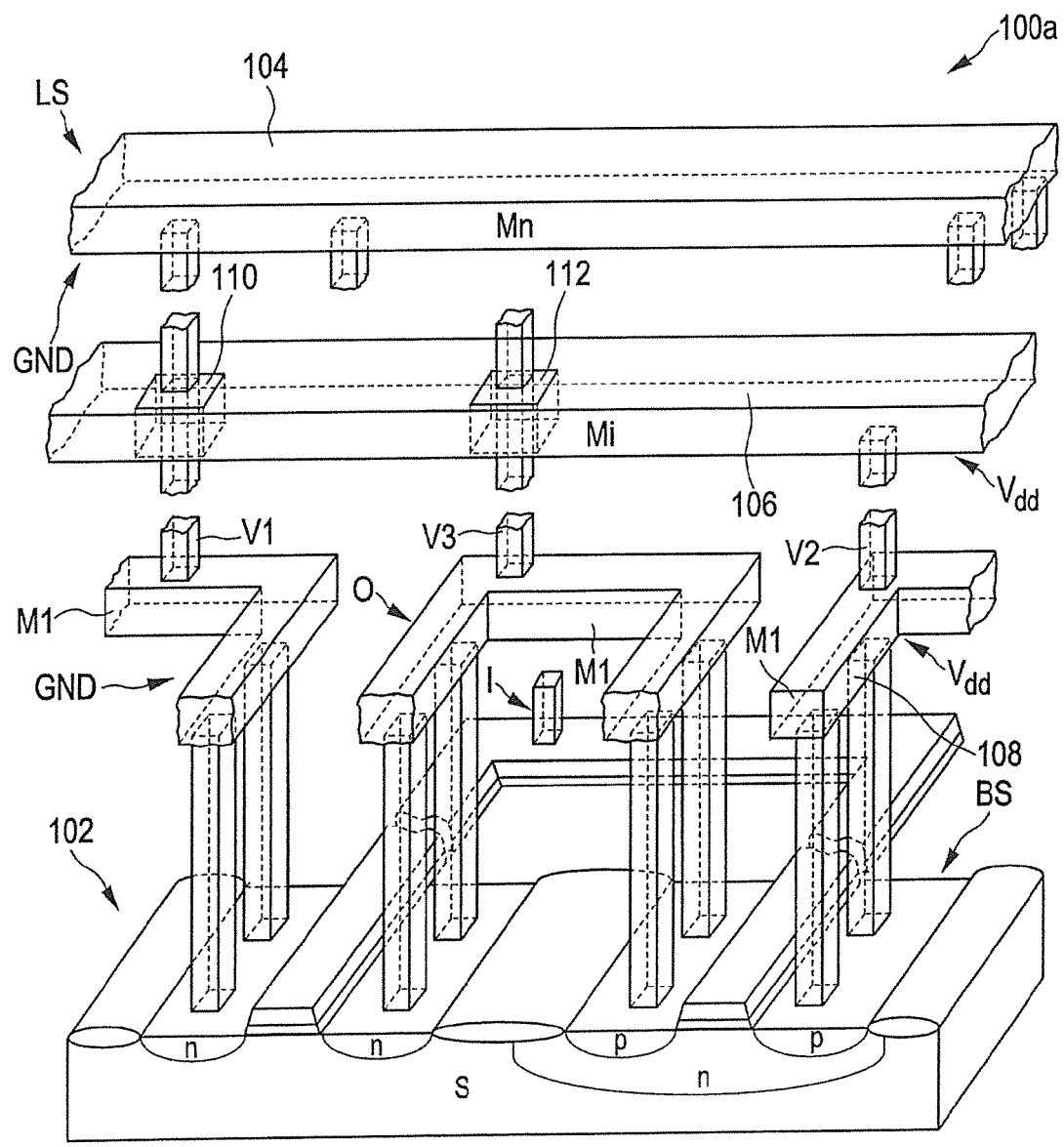
FIG. 3 shows another schematic view of an embodiment of the semiconductor device according to the invention, in a simplified exploded view.

With reference to a CMOS inverter gate chosen as an example, the following FIGS. 1-3 illustrate the difference between semiconductor devices according to the prior art and according to the present invention. The views shown are perspective views and are greatly simplified. Details of a layer structure, in particular in the conductor path stack, have been left out for the sake of clear presentation.

FIG. 1 shows a schematic view of a prior art semiconductor device for the specific example of a CMOS inverter. A component layer BS is disposed on a substrate S; a CMOS inverter comprising two complementary MOS transistors is shown here, as an example of a gate. A conductor path stack LS comprising three conductor path levels M1, M2 and M3 is disposed above the component layer.

Conductor path level M1 includes potential supply lines to a reference potential GND and to a supply potential Vdd, as well as inner gate wiring (I, O) as wiring for the transistors comprising the gate. Providing potential supply lines on conductor path level M1 is typical of prior art semiconductor devices. The potential supply lines connecting the components of the inverter gate to reference potential GND and supply potential $V_{dd}$ are implemented here as single conductor paths within conductor path level M1. In such a prior art semiconductor device, the supply of potential to other gates, not shown in the drawing for the sake of clarity, is also implemented via these conductor paths. In other words, the different gates share a common potential supply line via conductor paths provided for that purpose on conductor path level M1. According to one basic circuit layout, conductor paths on different levels are connected to each other by Vias V, in order to transmit input and output signals, in the form of electrical potentials or voltages between different gates or single components, on conductor paths I and O of the gate wiring.

FIG. 2 is a schematic view of an embodiment of the semiconductor device according to the invention, again for the example of a semiconductor device 100, of which, of the many circuit components or logic gates included therein, only one CMOS inverter is 102 is shown here.

The following description concentrates on the differences between the embodiment in FIG. 2 and the known embodiment shown in FIG. 1. In the present embodiment, the differences are manifested above all in the conductor path stack, which here contains n conductor path levels M1 to Mn.

For the sake of clear presentation, conductor path levels M2 to Mn−2 between the lowermost conductor path level M1 and the uppermost conductor path level Mn are not shown.

In the embodiment shown here, the uppermost conductor path level Mn is in the form of a single, self-enclosed metallic conductive layer of large area, whose perpendicular projection onto the component layer completely covers said component layer. It is basically possible as well to cover said component layer incompletely, for example if the non-covered circuit elements in the component layer do not need to be kept secret. However, the shielding effect against electromagnetic radiation is then reduced.

The metallic conductive layer 104 serves within the integrated circuit as a potential supply line for a reference potential GND. Unlike in the prior art, the connection of the gates to a reference potential GND provided either outside the device or inside the device is provided for all the circuit components in the semiconductor device via this large metallic conductive layer 104.

Disposing the metallic conductive layer 104 in the uppermost conductor path level Mn is advantageous, but not mandatory. Layer 104 can also be located on other conductor path levels below the uppermost conductor path level in order to create other embodiments. One advantage of arranging it far up the conductor path stack is that the conductor path stack underneath is also protected against viewing and thus against any undesired analysis of the circuit structure.

The inverter gate and all the other gates are each connected individually to said layer 104, which is referred to in the following as a reference potential area. It can be seen from the example of the inverter gate shown here that this connection can be realized in the form of a via V1 leading from conductor path level M1 to conductor path level Mn. Alternatively, however, it is also possible for the electrical connection of the inverter gate to the reference potential provided in the conductor path level Mn (the reference potential area) to be partly guided horizontally within one or more of the conductor path levels M2 to Mn−2 lying therebetween. In this way, it can be made even more difficult to decrypt the wiring of the many gates in such a semiconductor device. What it is important is that the connection between the gate and the reference potential area 104 is realized individually. Due to the large number of individual connections thus realized between the individual circuit components and reference potential area 104, an analysis of the circuit in an attack is rendered practically impossible.

In the semiconductor device shown in FIG. 2, the supply potential Vdd is likewise supplied with the aid of a metallic conductive layer 106 of large area, which is self-enclosed except for leadthroughs 110, and which is disposed here on the conductor path level Mn−1. Said layer 106 is referred in the following as supply potential area 106. Of large area also means here that the perpendicular projection of layer 106 onto the component layer covers the latter completely, at least to the extent that those parts of the circuit which must be kept secret are covered.

The inverter gate (referred to in the following as the circuit component), like all the other individual gates or circuit components, is also connected individually to supply potential area 106. The supply potential Vdd is passed on, via individual vias V2 for each of the individual circuit components, to conductor path level M1 and is distributed there, i.e., in conductor path level M1, via conductor paths to the individual gates of the circuit components. The CMOS inverter gate shown here is connected first of all to conductor path 108 and then from conductor path 108 to conductor path level M1 through via V2 to Vdd supply potential area 106.

In level M1, the inverter gate is also connected to the other gates of the circuit component to which it belongs. This circuit component is connected individually to reference potential GND and to supply potential Vdd via the vias already shown.

Thus, implementing the potential supply lines to the reference potential GND and to the supply potential $V_{dd}$ as metallic conductive layers 104 and 106 means that, with regard to the protective effect achieved, any electromagnetic radiation emitted from the CMOS inverter during operation is shielded, and optical access to the inner structure of the device is made more difficult, if not entirely prevented. The effect of individually embodying the potential supply line between layer 104, 106 and conductor path level M1 is that any circuit analysis is made severely more difficult in the event of an invasive or semi-invasive attack, for which it is necessary to remove metallic conductive layers 104 and 106. The supply of potential to the circuit components is destroyed, and any optical analysis of the circuit on the basis of its conductor path structure can only be done by investing a much greater amount of time and analytical technology, compared to known solutions, which in practice is not feasible.

The present embodiment is suitable for semiconductor devices having three or more conductor path levels. The materials used for the conductor paths can also be used as material for the metallic conductive layers in the conductor path stack.

It is irrelevant which circuit components are disposed in the component layer, be it in the form of individual components or gates, such as logic gates. The invention can be used in the most diverse kinds of integrated circuit, be it in logic circuits, memory circuits or in other types of circuit. It is advantageous for increasing the efficacy of the protected measures described when the circuit contains a relatively large number of circuit components, which typically amounts to more than 100 and preferably to more than 1000.

It is also possible to connect only one of the two potential areas 104, 106 to the circuit components individually in the manner just described. The protection, achieved with the solution according to the invention, against an invasive or semi-invasive attack is not substantially reduced as a result. Shielding against electromagnetic radiation can also be achieved with a single metallic layer of large area.

FIG. 3 shows a schematic view of another embodiment of the inventive semiconductor device 200, which again shall be described in the following with reference to an example of a section showing a CMOS inverter. Due to the substantial similarity with the embodiment in FIG. 2, the reference signs used in FIG. 2 shall also be used in the following for identical structural features when describing FIG. 3.

In the embodiment shown in FIG. 3, supply potential area 106 is arranged in conductor path stack LS with a greater spacing from reference potential area 104. In other words, the two layers 104 and 106 are not arranged on adjacent conductor path levels. Layer 106 forming the supply potential area is arranged instead on a conductor path level Mi, where i<n−1. Above conductor path level Mi shown in the Figure and below the uppermost conductor path level Mn, there is at least one further conductor path level Mi+1 to Mn−1, not shown here. These further conductor path levels contain standard conductor paths that form wired connections to further gates (likewise not shown here). The inner gate wiring is connected by the wiring through vias V3 to further gates. A leadthrough 112 through supply potential area 106 is provided in each case for this purpose. FIG. 3 shows only one such via, which in the present example connects the output of CMOS inverter 102 to the wiring on conductor path levels Mi+1 to Mn−1.

In this embodiment, optical access to the lower levels and to component layer BS is only possible when all the conductor path levels from Mi-Mi−1 have been removed. The result is that the respective gate wirings must also be destroyed and that it is no longer possible to restore the original circuit without having additional knowledge of it.

Figure 4:
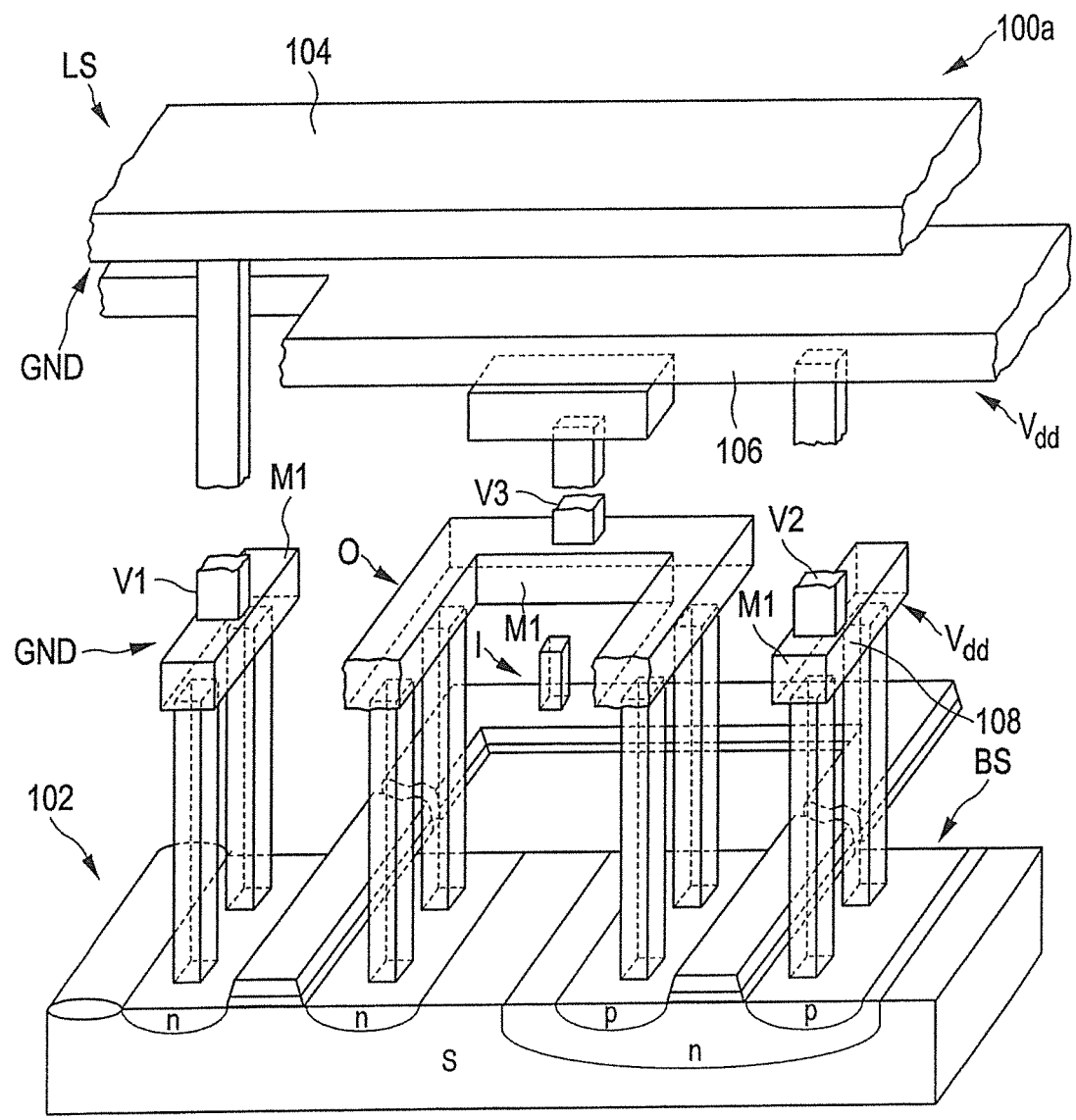
FIG. 4 shows another schematic view of an embodiment of the semiconductor device according to the invention, in a simplified exploded view.

FIG. 4 shows a schematic view of another embodiment of the inventive semiconductor device in a simplified exploded view, for the example of a single gate of a CMOS inverter. In FIG. 4, the single gate shown is connected solely via individual conductor path structures, through vias, to the reference potential GND and the supply potential $V_{dd}$.

FIG. 4 thus shows a single gate as a circuit component which is individually connected to the reference potential GND, in the form of metallic layer Mn, and to the supply potential $V_{dd}$, similarly in the form of metallic layer Mn−1. The individual contacts for single gates to the reference potential and the supply potential in the higher layers of the conductor path stack increases even more the effort that is involved in creating such contacts after an attack involving destruction of the metallic layers.

In addition to the arrangement of the reference potential GND and the supply potential $V_{dd}$ in the uppermost two layers of conductor path stack Mn and Mn−1, as shown in FIG. 4, the contacts for single gates can also be realized advantageously, by way of alternative, when the reference potential GND and the supply potential $V_{dd}$ are arranged in other layers of the conductor path stack except for the bottommost conductor path level M1, and in levels that are above the conductor path stack.

Using two adjacent metallization levels for the operating supply voltage results in a capacitive property—this is particularly the case when the two uppermost metallization levels are used—and this capacitive property can reduce the extent to which the energy consumption can be monitored, and thus increase the security of the circuit.

FIGS. 5-9 show schematic views for comparing and contrasting the conductor path levels of a prior art semiconductor device, in FIG. 5a-FIG. 9a, and of an embodiment of a semiconductor device according to the invention, in FIG. 5b-FIG. 9b, the example being that of a 3×3 multiplier.

The comparison begins in FIG. 5 with the first conductor path level and ends in FIG. 9 with the last conductor path level. The views are progressive, so previously shown conductor path levels remain visible unless they are covered by elements of the conductor path levels that follow. The elements of the different conductor path layers are marked with different hatchings.

Figure 5A:
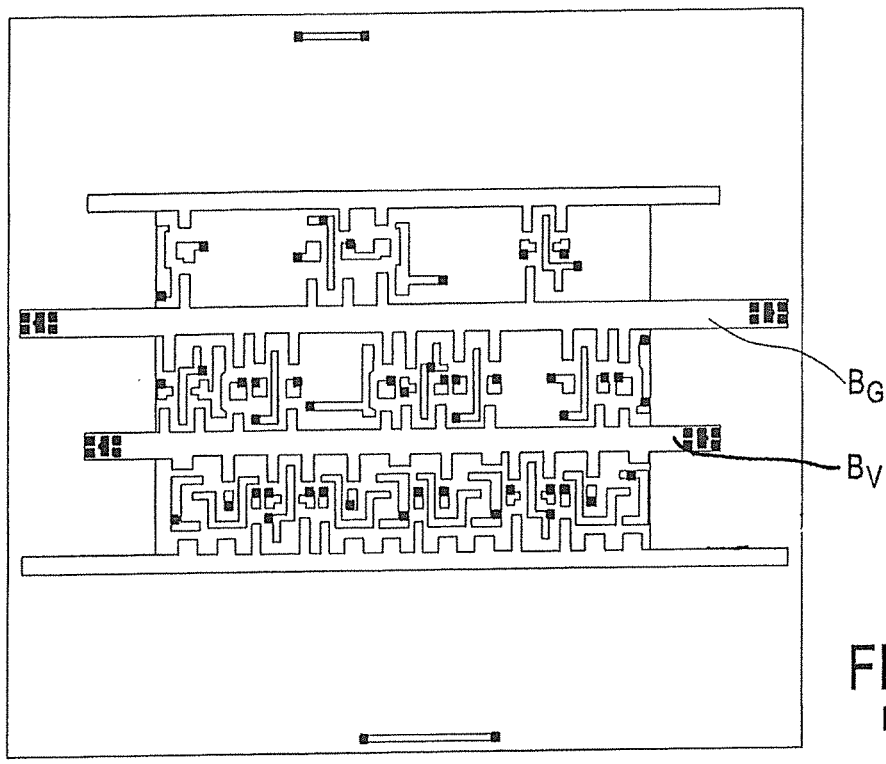
FIGS. 5-9 show schematic views of the conductor path levels of a prior art semiconductor device (FIG. 5a-FIG. 9a) and of an embodiment of a semiconductor device according to the invention (FIG. 5b-FIG. 9b)
Figure 5B:
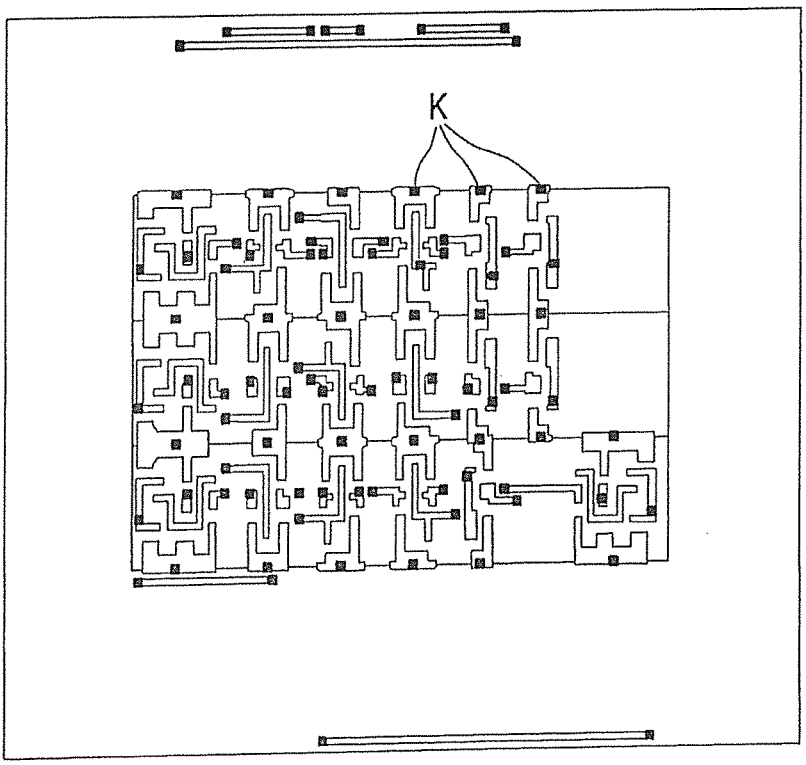

FIG. 5a shows the first conductor path level M1 of a conductor path stack of a prior art semiconductor device. In conductor path level M1, the shared connections of all the circuit components to the reference potential and the supply potential are implemented as broad contact paths BG and BV leading to the sides of the device. FIG. 5b, in contrast, shows the first conductor path level M1 of a conductor path stack of a semiconductor device according to the invention. There are individual contacts K to the components that are located under conductor path level M1. Leads connecting the contacts to the reference potential and the supply potential are not implemented here.

Figure 6A:
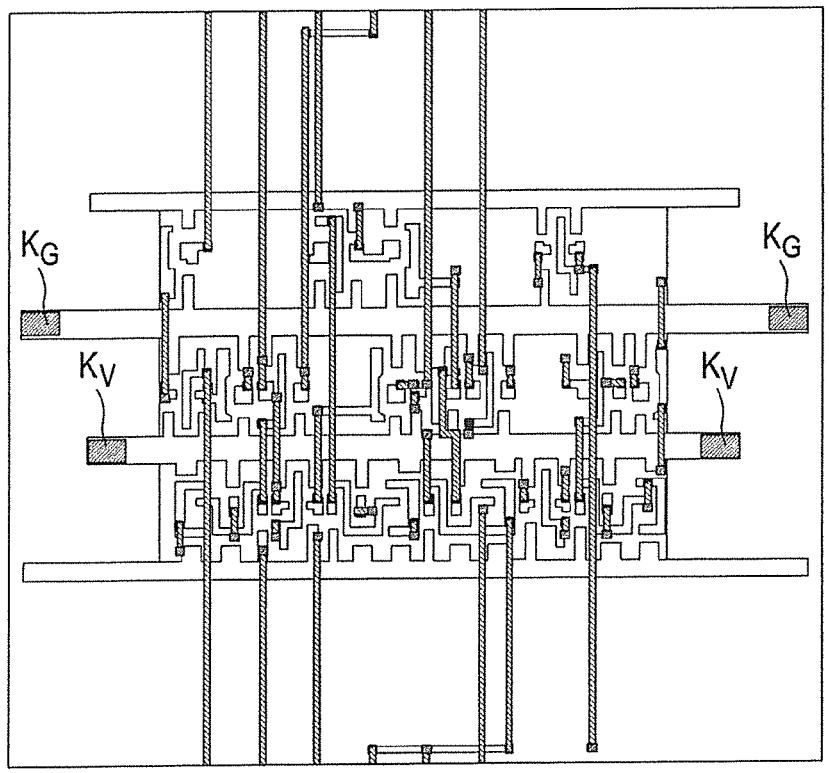
Figure 6B:
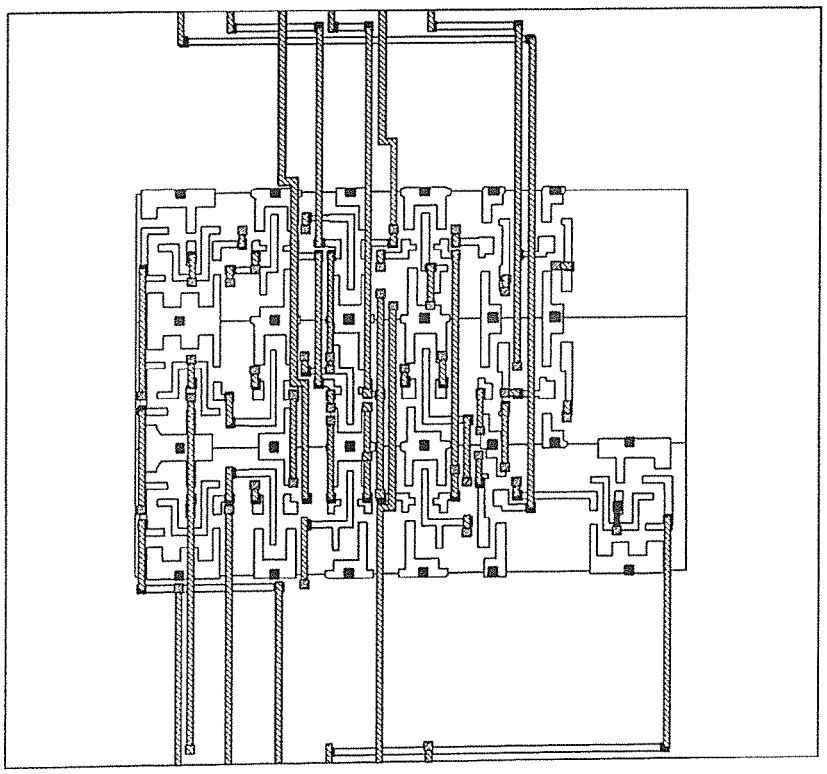

FIG. 6a shows the second conductor path level of the prior art semiconductor device. Various circuit components are connected together here. At the ends of contact paths $B_G$ and $B_V$, contacts $K_G$ and $K_V$ for the reference potential and the supply potential are guided upwards. FIG. 6b shows the second conductor path level of the semiconductor device according to the invention. Here, too, the various circuit components are connected together in this level, and here again the individual contacts for the reference potential and the supply potential are guided upward.

In the example shown in FIGS. 5b-9b the contacts to Vdd and GND are guided perpendicularly. However, this can also be implemented in such a way that the contact is guided horizontally at first, in particular contact levels, and then guided vertically onwards at a place that is not perpendicularly above the component. These vertical and horizontal contact paths make the effort involved in reconstructing the contacts even greater.

Figure 7A:
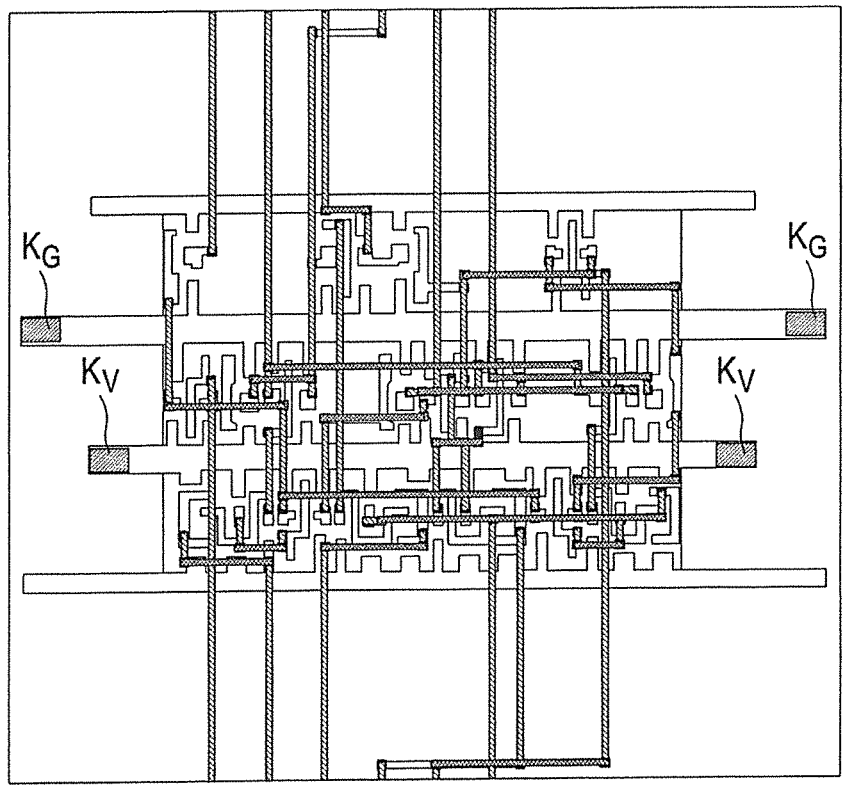
Figure 7B:
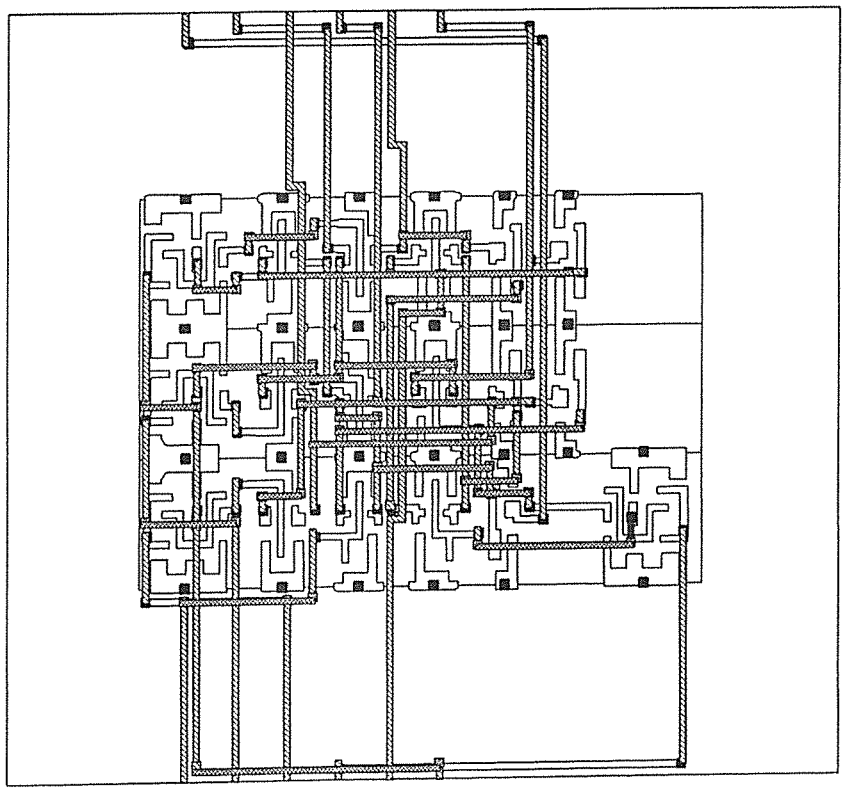

FIG. 7a and FIG. 7b show the third conductor path level M3. As already done in the second plane, the circuit components are interconnected here as well, and the contacts to the reference potential and the supply potential are guided further upward, for all the components via shared contacts $K_G$ and $K_V$ in the prior art (FIG. 7a) and individually in the device according to the invention (FIG. 7b).

Figure 8A:
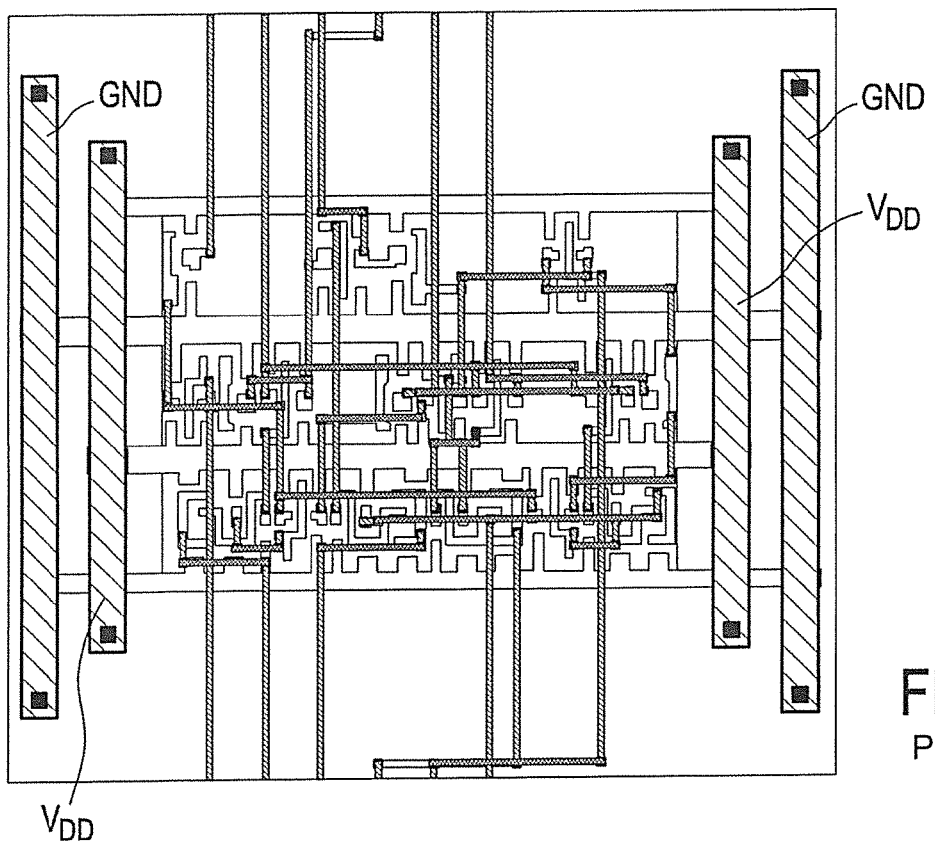
Figure 8B:
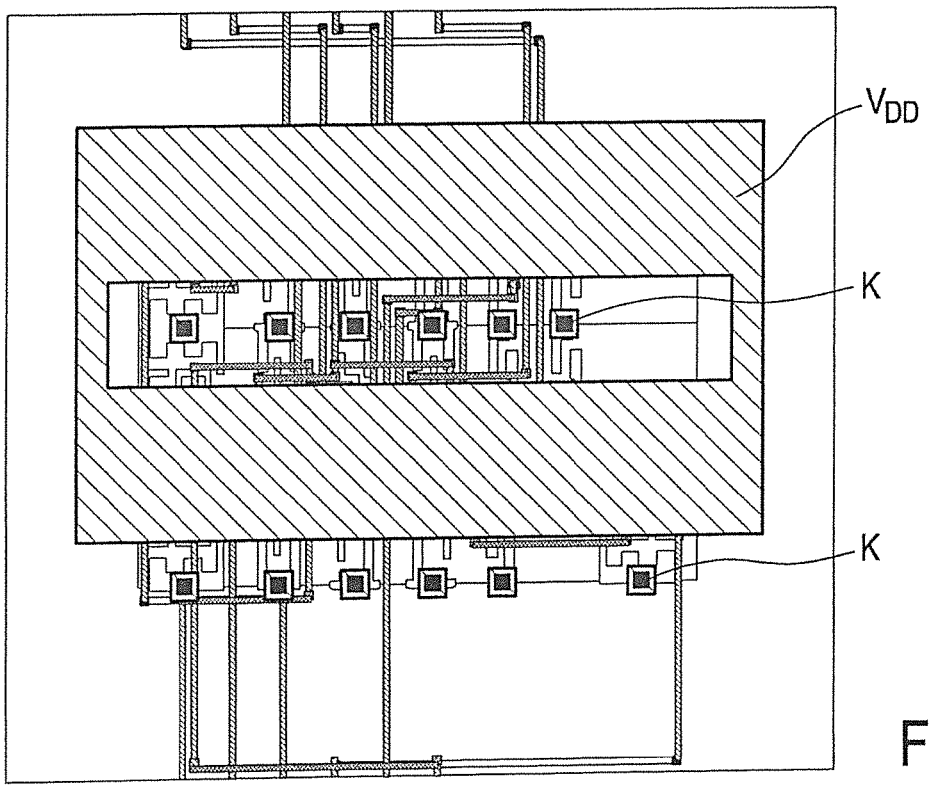

FIG. 8a shows the implementation, in the prior art, of the respective parts of the reference potential GND and the supply potential $V_{DD}$ in the form of metal strips in conductor path level M4. It becomes clear here that the interconnection of the components is not covered by the potentials. FIG. 8b shows the implementation of the $V_{DD}$ supply potential in the form of a metal layer that covers parts of the components of the semiconductor device, thus providing visual screening as well. In the areas that are still exposed, contact guides K for contacting the reference potential GND are implemented.

Figure 9A:
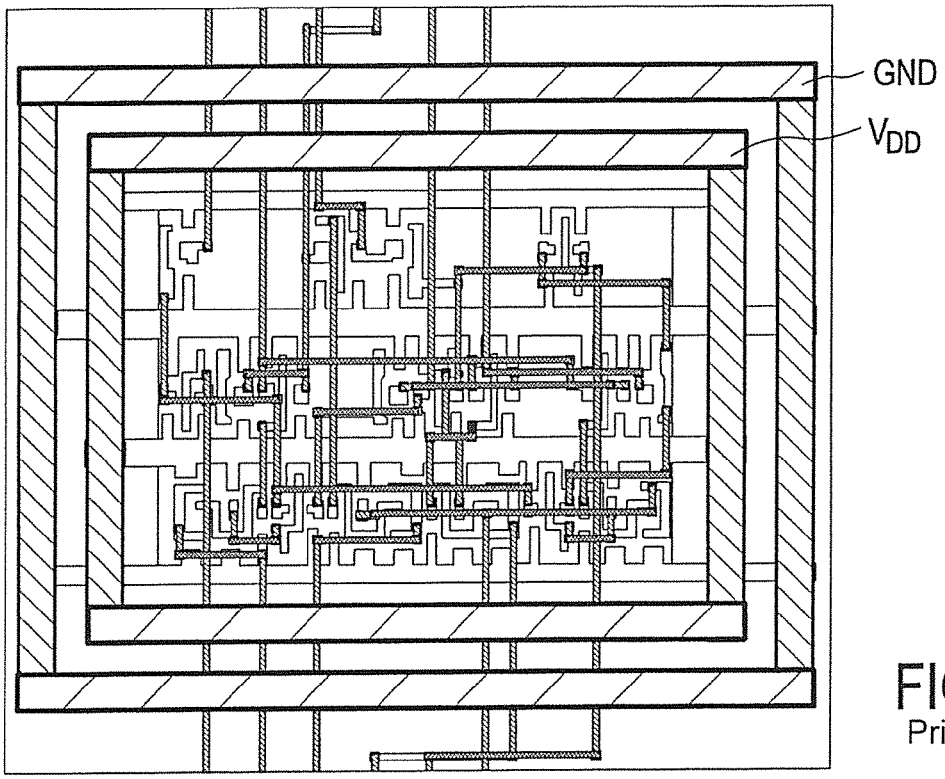
Figure 9B:
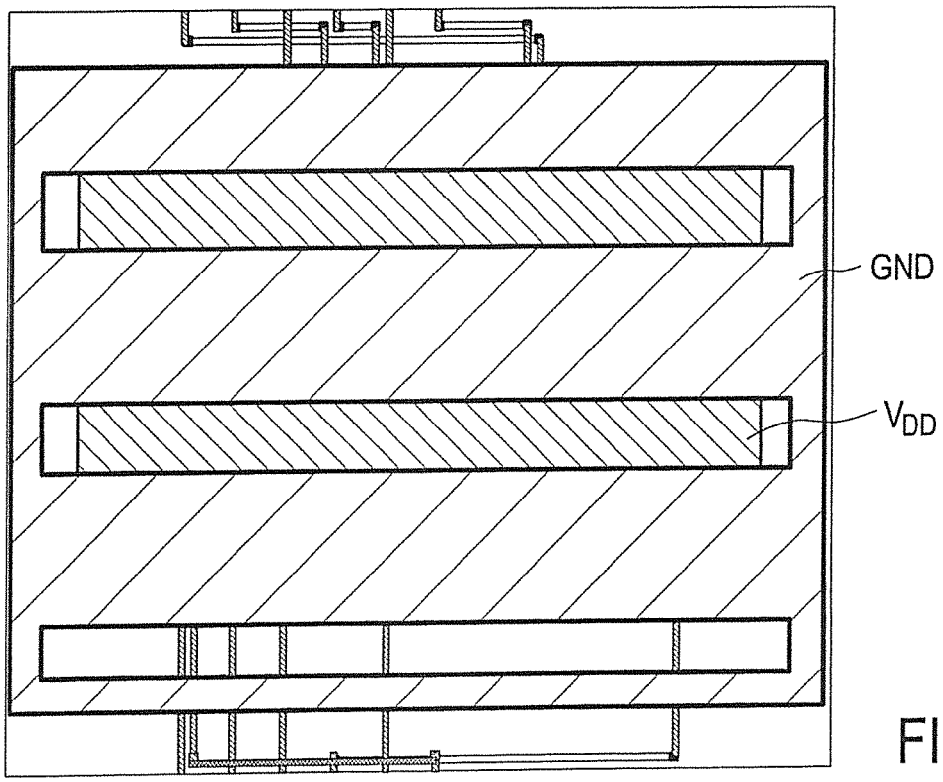

FIG. 9a shows the last conductor path level M5 in the prior art. In this level, the implementation of reference potential GND and supply potential $V_{DD}$ is completed. In the plan view, the two potentials provide a frame around the interconnection of the components that is still not covered by a metallic layer. FIG. 9b shows the implementation of the reference potential GND as a metal layer. The semiconductor device is now completely hidden optically by the reference potential and the supply potential. The metal layer shown in FIG. 9b is not continuous, but has two openings under which there are continuous areas of the metal layer of the supply potential $V_{DD}$.

Figure 10A:
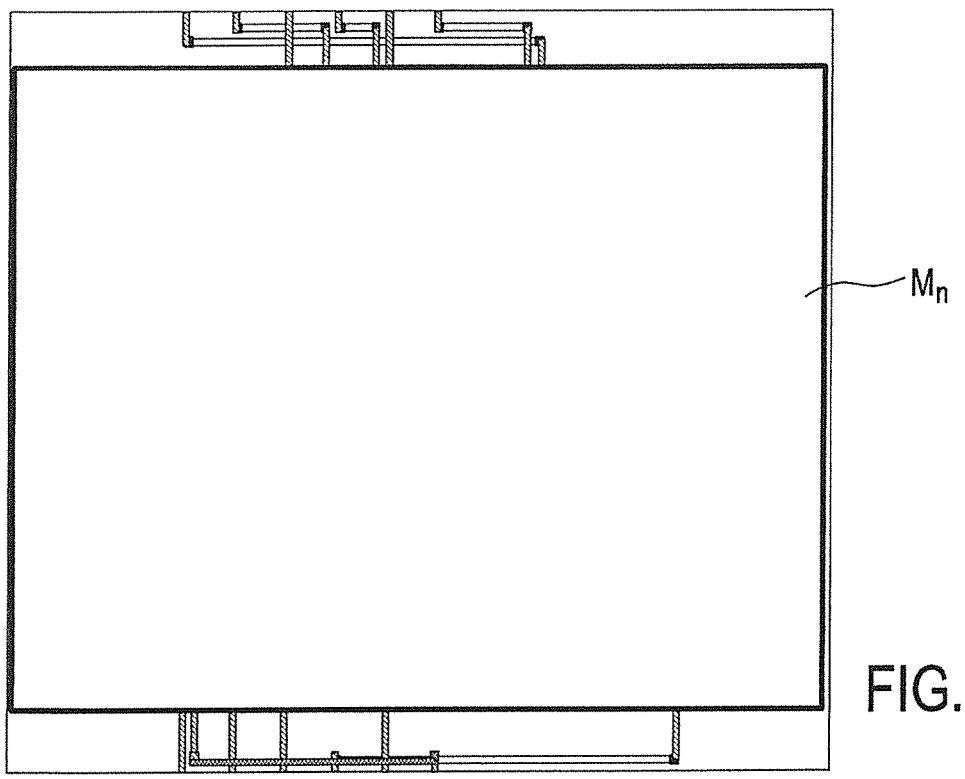
FIGS. 10a-10b shows schematic views of embodiments of a metallic layer in a semiconductor device according to the invention.
Figure 10B:
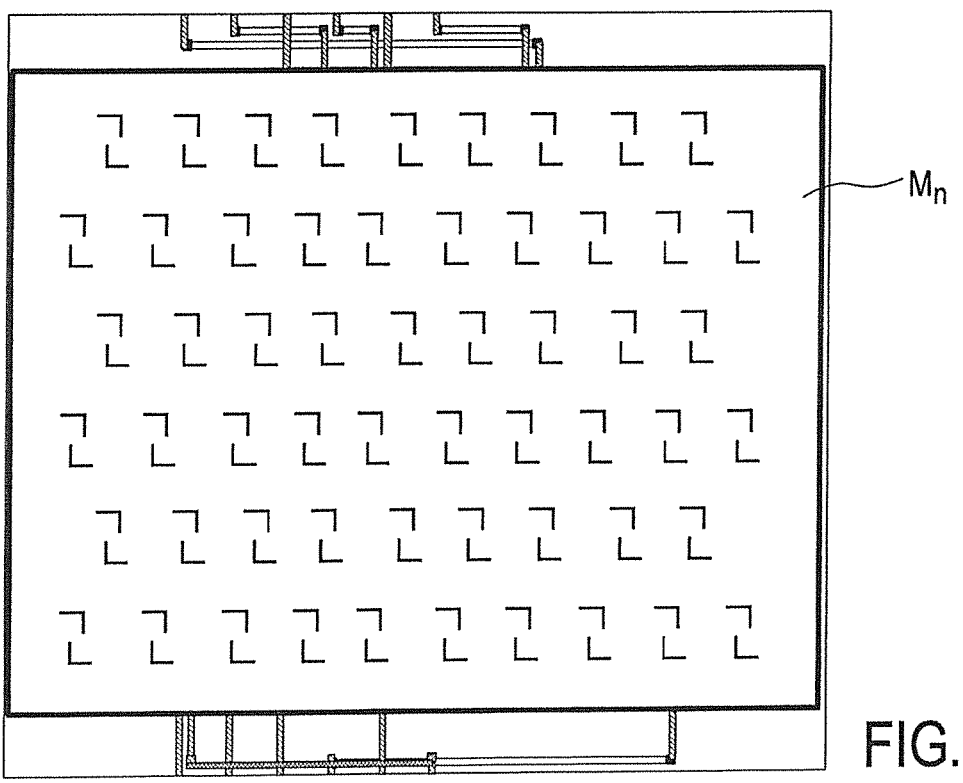

FIG. 10a shows another embodiment of the uppermost metal layer Mn of a semiconductor device according to the invention, said layer being used as a reference potential. Here, the metal layer is continuous and has no openings. The invention also allows the uppermost metal layer to be provided with small openings (e.g., slots, as in FIG. 10b). These openings are used to prevent mechanical stresses.

The invention claimed is:

1. A semiconductor device comprising
a substrate,
a component layer on said substrate, said component layer containing a plurality of electronic circuit components in the form of monolithically integrated single components, the monolithically integrated single components being formed by individual transistors or individual diodes, or in the form of monolithically integrated logic gates,
a conductor path stack on a side of the component layer facing away from the substrate,
a first monolithically integrated potential supply line which is connected or connectable to an electrical reference potential, and
a second monolithically integrated potential supply line which is connected or connectable to an electrical supply potential, wherein
the first potential supply line and the second potential supply line have at least one metallic conductive layer, any of the at least one metallic conductive layer of the first potential supply line being electrically insulated from any of the at least one metallic conductive layer of the second potential supply line, and wherein
the metallic conductive layer of the first and/or of the second potential supply line are each connected directly and individually to all the circuit components via respective individual conductor path structures.

2. The semiconductor device according to claim 1, wherein at least one of the potential supply lines is not arranged in a lowermost metallization level of the conductor path stack.

3. The semiconductor device according to claim 1, wherein the at least one metallic conductive layer forms a surface which is without openings, apart from at least one via leadthrough or very small openings for preventing mechanical stress, and whose perpendicular projection onto the component layer substantially or completely covers said component layer.

4. The semiconductor device according to claim 1, wherein the at least one metallic conductive layer forms a network lying in a single layer plane of the conductor path stack, or a gate lying in a single layer plane of the conductor path stack, said network or gate substantially or completely covering the component layer with its lateral dimensions in perpendicular projection onto the component layer.

5. The semiconductor device according to claim 1, wherein at least one of the at least one metallic conductive layer has leadthroughs, through which vias are guided perpendicularly to the respective metallic conductive layer.

6. The semiconductor device according to claim 1, wherein the at least one metallic conductive layer of the first potential supply line is formed by a single first metallic conductive layer and the at least one metallic conductive layer of the second potential supply line is formed by a single second metallic conductive layer, and wherein the single first metallic conductive layer and the single second conductive layer are arranged in conductor path levels of the conductor path stack that are adjacent to each other in the direction of stacking.

7. The semiconductor device according to claim 1, wherein only one of the potential supply lines is arranged inside the conductor path stack.

8. The semiconductor device according to claim 1, wherein the first and the second potential supply lines each have a respective single metallic conductive layer, and wherein the respective single metallic conductive layers of the first and of the second potential supply line are arranged laterally adjacent to one another in a shared level parallel to a main surface of the substrate and are electrically insulated from one another.

9. The semiconductor device according to claim 8, wherein, apart from a lateral spacing for electrical insulation of the respective single metallic conductive layers of the first and the second potential supply line from each other within the shared level, a perpendicular projection of said metallic conductive layers of the first and the second potential supply line onto the component layer substantially or completely covers the component layer.

10. The semiconductor device according to claim 1, wherein both of the potential supply lines are arranged inside the conductor path stack.

11. The semiconductor device according to claim 1, wherein a metallic conductive cap layer is arranged in the conductor path stack in a conductor path level which, in comparison with all other of the conductor path levels of the conductor path stack, is furthest away from the component layer.

12. The semiconductor device according to claim 1, characterized in that either the same potential supply line or different potential supply lines of one or more conductor path levels of the conductor path stack are realized between two metallic conductive layers.

13. The semiconductor device according to claim 1, wherein the plurality of electronic circuit components includes more than 100 circuit components.

14. The semiconductor device according to claim 1, wherein the plurality of electronic circuit components includes more than 1000 circuit components.

* * * * *